(12) United States Patent
Suzuki et al.

(10) Patent No.: US 8,814,298 B2
(45) Date of Patent: Aug. 26, 2014

(54) SEMICONDUCTOR DEVICE, METHOD OF MANUFACTURING SEMICONDUCTOR DEVICE, AND LIQUID DISCHARGE APPARATUS

(71) Applicant: Canon Kabushiki Kaisha, Tokyo (JP)

(72) Inventors: Satoshi Suzuki, Fujisawa (JP); Noboyuki Suzuki, Oita (JP); Masanobu Ohmura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/889,630

(22) Filed: May 8, 2013

(65) Prior Publication Data
US 2013/0314463 A1 Nov. 28, 2013

(30) Foreign Application Priority Data
May 28, 2012 (JP) ................................. 2012-121388

(51) Int. Cl.
*B41J 29/38* (2006.01)
*H01L 29/78* (2006.01)
*H01L 29/66* (2006.01)
*H01L 29/786* (2006.01)
*H01L 21/82* (2006.01)

(52) U.S. Cl.
CPC .... *H01L 29/78654* (2013.01); *H01L 29/66477* (2013.01); *H01L 21/82* (2013.01)
USPC ................................. 347/9; 257/368; 438/197

(58) Field of Classification Search
CPC ................... H01L 29/78654; H01L 29/66477; H01L 29/0847; H01L 21/82; H01L 27/092
USPC ........................... 347/9, 12; 257/368; 438/197
See application file for complete search history.

(56) References Cited

U.S. PATENT DOCUMENTS

| | | | | |
|---|---|---|---|---|
| 8,563,406 B2 * | 10/2013 | Takafuji et al. | ............... | 438/473 |
| 8,659,073 B2 * | 2/2014 | Kitajima | ....................... | 257/328 |
| 2013/0234248 A1 | 9/2013 | Suzuki et al. | ................. | 257/338 |

FOREIGN PATENT DOCUMENTS

JP H02-015672 1/1990

* cited by examiner

*Primary Examiner* — An Do
(74) *Attorney, Agent, or Firm* — Fitzpatrick, Cella, Harper & Scinto (57) ABSTRACT

A semiconductor device includes a first conductivity type well region formed by counter doping; a transistor having source and drain regions having a second conductivity type, at least one of the regions being arranged in the well region; a LOCOS region arranged around the at least one region in the well region; and a channel stop region having the first conductivity type arranged under the LOCOS region. The at least one region is arranged at a distance from a tip of a bird's beak of the LOCOS in a direction parallel to a channel width of the transistor. The channel stop region is arranged at a distance from the tip of the bird's beak at an opposite side to the at least one region.

9 Claims, 13 Drawing Sheets

SEMICONDUCTOR DEVICE, METHOD OF MANUFACTURING SEMICONDUCTOR DEVICE, AND LIQUID DISCHARGE APPARATUS

BACKGROUND OF THE INVENTION

1. Field of the Invention

The present invention relates to a semiconductor device, a method of manufacturing a semiconductor device, and a liquid discharge apparatus.

2. Description of the Related Art

In an N-channel MOS transistor formed in a P-type well region, a P-type impurity concentration in the P-type well region in a vicinity of an interface between the P-type well region and an element isolation region decreases, and an N-type inversion layer becomes easy to generate. In order to prevent a source and a drain from short-circuiting through the N-type inversion layer, in the Japanese Patent Laid-Open No. 2-15672, a P-type diffusion layer is formed in contact with a side surface of the element isolation region. In this literature, in addition, a reduction of a tolerable junction voltage of the N-channel MOS transistor is suppressed, by placing a source region and a drain region away from the P-type diffusion layer.

SUMMARY OF THE INVENTION

In the N-channel MOS transistor described in the Japanese Patent Laid-Open No. 2-15672, since the element isolation region is formed by the STI method, it is easy to form the P-type diffusion layer in contact with the side surface of the element isolation region. However, when the element isolation region is formed by a LOCOS method, a tip of a bird's beak may extend out from the P-type diffusion layer formed under the element isolation region. The short-circuit between the source and the drain cannot be suppressed while suppressing the degradation in the breakdown voltage characteristics, by only placing the source region and the drain region away from the P-type diffusion layer as described in the literature. Thus, one aspect of the present invention provides a technique to suppress the short-circuit between the source and the drain of the transistor in which the element isolation region is formed by the LOCOS method, while suppressing the degradation in the break down voltage characteristics.

A first aspect provides a semiconductor device comprising: a first conductivity type well region formed by counter doping; a transistor having a source region and a drain region having a second conductivity type which is different from the first conductivity type, at least one of the source region and the drain region being arranged in the well region; a LOCOS region arranged around the at least one of the source region and the drain region in the well region; and a channel stop region having the first conductivity type arranged under the LOCOS region, wherein the at least one of the source region and the drain region is arranged at a distance from a tip of a bird's beak of the LOCOS in a direction parallel to a channel width of the transistor, and the channel stop region is arranged at a distance from the tip of the bird's beak at an opposite side to the at least one of the source region and the drain region.

A second aspect provides a method of manufacturing a semiconductor device having a transistor, comprising: preparing a semiconductor substrate having an oxide film which is arranged on a well region having a first conductivity type, the well being formed by a counter doping; forming, on the well region, a first mask which covers a region where a source region and a drain region of the transistor are to be formed, and exposes a region where a LOCOS region is to be formed; implanting an impurity having the first conductivity type in the well region through an opening of the first mask; removing the first mask after forming the LOCOS region by selectively growing the oxide film; forming, on the well region and the LOCOS region, a second mask which exposes a region where the source region and the drain region are to be formed, and covers a portion extending orthogonal to a channel width direction of the transistor from a tip of a bird's beak of the LOCOS region; and forming the source region and the drain region by implanting an impurity having a second conductivity type that is different from the first conductivity type through an opening of the second mask in the well region.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Exemplary embodiments of the present invention will be described in detail with reference to the accompanying drawings. Throughout the various embodiments, similar elements are given the same reference numerals in the drawings, and redundant description will be omitted. Also, the embodiments can be modified and combined if appropriate. In the following embodiments, although an explanation is given in the case where a P-type is used as a first conductivity type and an N-type as a second conductivity type, the opposite polarity can be used.

Figure 1A:
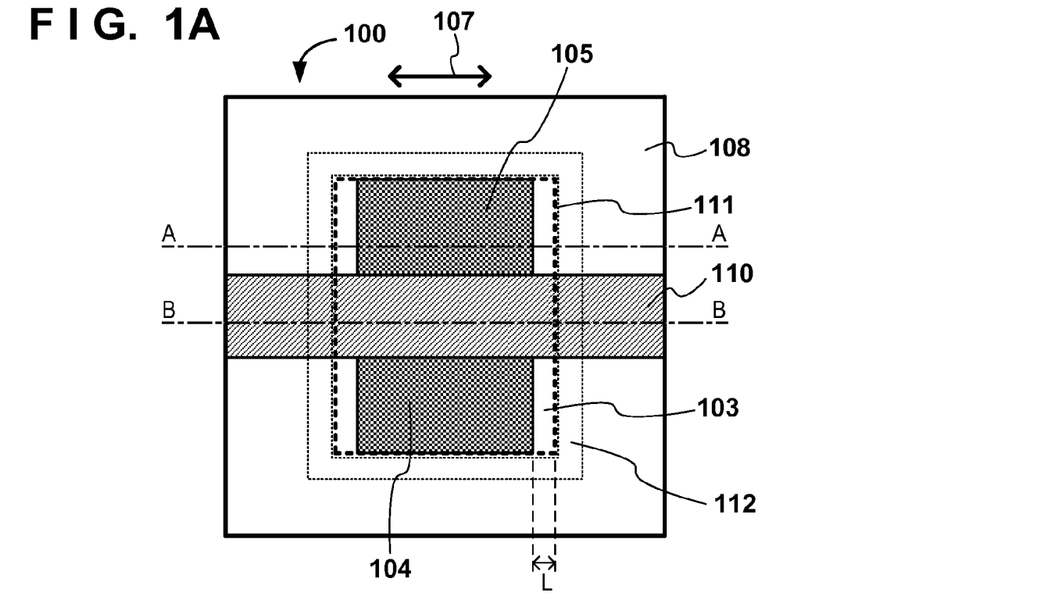
FIGS. 1A-1C are schematic diagrams illustrating an example of a structure of a semiconductor device according to an embodiment of the present invention.
Figure 1B:
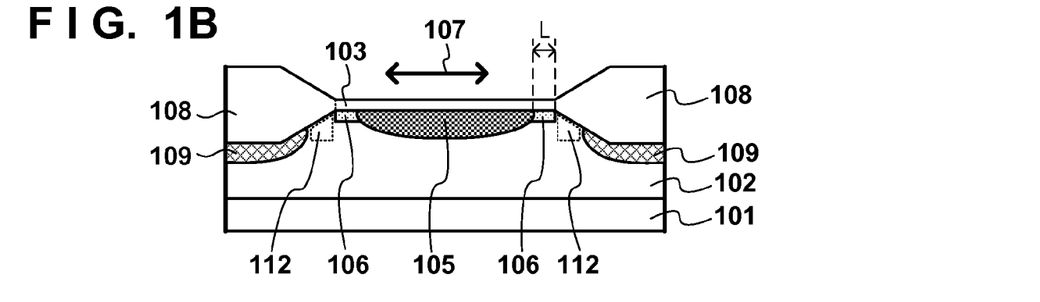
Figure 1C:
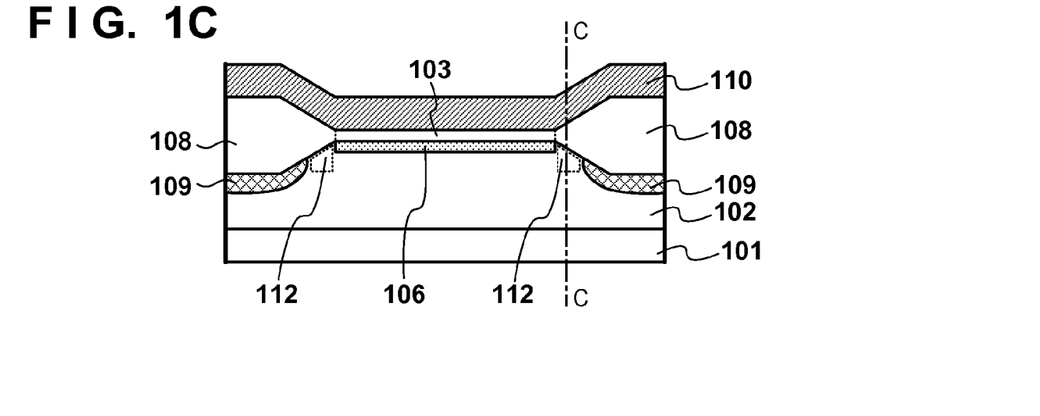

An exemplary structure of a semiconductor device 100 according to a present embodiment will be explained with reference to FIGS. 1A-1C. The semiconductor device 100 has an N-channel MOS transistor that is one type of insulated gate transistor, and FIGS. 1A-1C focus on the portion where this transistor is formed. FIG. 1A is a plan view of this portion, FIG. 1B is a cross-sectional view along the line A-A in FIG. 1A, and FIG. 1C is a cross-sectional view along the line B-B in FIG. 1A. Although a source region 104 and a drain region 105 are arranged under an insulating layer 103, the source region 104 and the drain region 105 are depicted in a visible manner in the plan view of FIG. 1A, for the purpose of explanation.

A semiconductor substrate of the semiconductor device 100 has an N-type semiconductor region 101, and a P-type well region 102 where an impurity is doped is formed in the semiconductor region 101. The N-type semiconductor region 101 may be a part of an N-type semiconductor substrate or may be an N-type well region formed in a P-type semiconductor substrate. The semiconductor device 100 has the insulating layer 103 on the well region 102, and a part of the insulating layer 103 acts as a gate insulation film of a transistor. The semiconductor device 100 has an N-type source region 104 and a drain region 105 placed separately in the well region 102, and has a channel region 106 between the source region 104 and the drain region 105. The semiconductor device 100 has a LOCOS region 108 formed by the LOCOS method as an element isolation region on the well region 102, at the periphery of the source region 104, the drain region 105 and the channel region 106. The LOCOS region 108 insulates and separates the transistor from other elements. In order to improve the element isolation characteristics, the semiconductor device 100 may have a P-type channel stop region 109 in the well region 102 under the LOCOS region 108. The semiconductor device 100 has a gate electrode 110 on the channel region 106 through the insulating layer 103. The gate electrode 110 extends in a direction 107 parallel to the channel width, and covers a part of the LOCOS region 108.

In FIG. 1A, a contour 111 of the LOCOS region 108 is shown with a dotted line, for reference. In the present embodiment, the contour 111 is located at the boundary between the LOCOS region 108 and the insulating layer 103. The LOCOS region 108 reaches the contour 111 through a transition region called a bird's beak in which the film thickness gradually becomes thinner. In other words, a tip of the bird's beak is located at the contour 111.

The source region 104 and the drain region 105 are placed at a distance L from the LOCOS region 108 (from the contour 111) in the direction 107 parallel to the channel width. By thus placing the source region and the drain region at a distance from the LOCOS region, a leak current passing through a region 112, in the well region 102, which is located under the LOCOS region 108 and in which the channel stop region 109 is not arranged can be suppressed.

Figure 2:
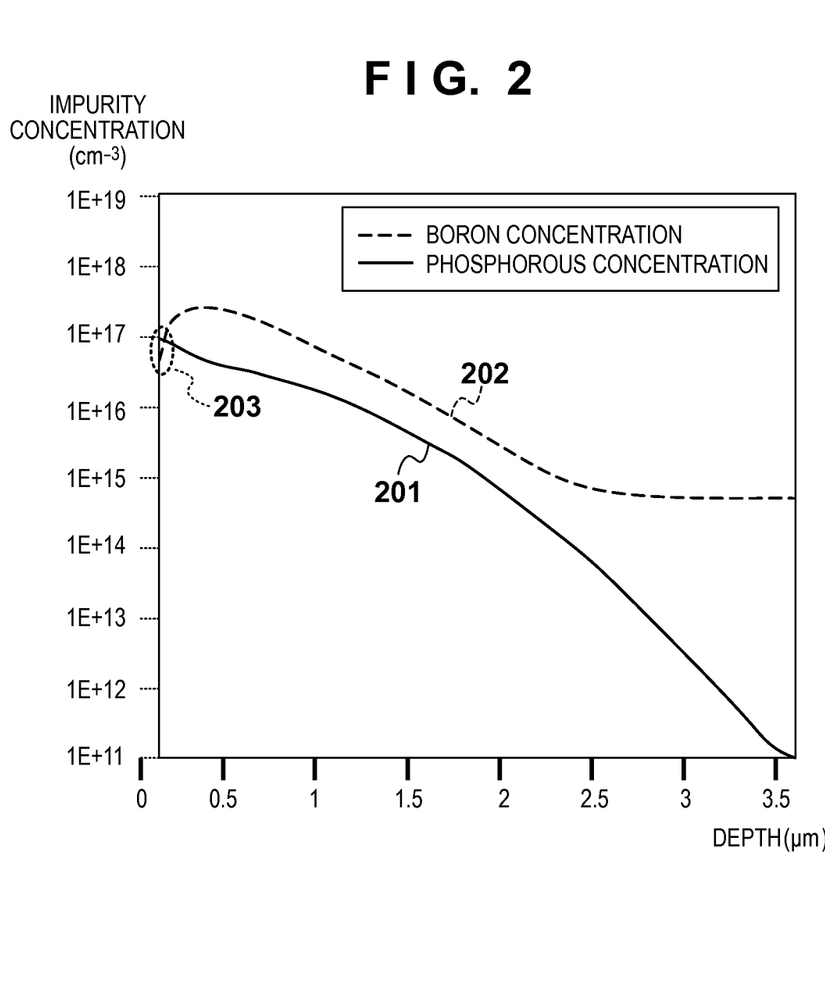
FIG. 2 is a diagram explaining an example of an impurity concentration profile of a semiconductor device according to an embodiment of the present invention.

Here, the effect of the semiconductor device 100 in FIGS. 1A-1C will be explained with reference to FIG. 2. FIG. 2 is a graph showing an example of an impurity concentration profile along the line C-C in FIG. 1C. A graph 201 shows an impurity concentration of phosphorous measured from a surface of the LOCOS region 108 in the depth direction, and a graph 202 shows an impurity concentration of boron measured from the surface of the LOCOS region 108 in the depth direction. In the semiconductor device 100, the well region 102 is formed by counter doping boron into the semiconductor region 101 formed by doping, for example, phosphorous. Therefore, the well region 102 has both phosphorous and boron as impurities. In the region 112 of the well region 102 in FIGS. 1A-1C, the channel stop region 109 is not placed, thus the boron concentration is lower compared to the channel stop region 109. Also, during thermal oxidation for forming the LOCOS region 108, the boron in the region 112 diffuses to the LOCOS region 108, thus the boron concentration in the region 112 decreases. In addition, the phosphorus contained in the well region 102 may concentrate in the vicinity of an interface to the LOCOS region 108. Therefore, as in the portion enclosed by a dotted line 203 in FIG. 2, in the region 112 located at a shallow portion of the well region 102, the phosphorous concentration may exceed the boron concentration. As a result, an inversion layer 112 becomes easy to generate. In the case where, in the direction 107 parallel to the channel width, the LOCOS region 108 and the source region 104 are placed adjacently, and the LOCOS region 108 and the drain region 105 are placed adjacently, a leak current may flow though the region 112. Even if the channel stop region 109 extended to the region 112, when the impurity concentration in the channel stop region is low, the inversion layer is easy to generate in the region 112 in the same way.

The leak current flowing through the region 112 can be suppressed by extending the channel stop region 109 to the region 112, and increasing the boron concentration at the region 112. However, in this case, the breakdown characteristics of a PN junction between the P-type channel stop region 109 and the N-type drain region 105 degrades.

Thus, the semiconductor device 100 according to the embodiment suppresses the leak current flowing through the region 112, by placing the source region 104 and the drain region 105 at the distance L from the LOCOS region 108, in the direction 107 parallel to the channel width. For example, the distance L is set to be greater than or equal to 0.3 µm, in the case where phosphorus is doped at the amount of more than $1E+16$ cm$^{-3}$ in the well region 102, and arsenic is doped at the amount of more than $1E+19$ cm$^3$ in the source region 104 and the drain region 105. The leak current that arises between the source region 104 and the drain region 105 can thereby be effectively suppressed. Although both the source region 104 and the drain region 105 are placed away from the LOCOS region 108 in the example above, the leak current flowing through the region 112 can also be suppressed by placing one of the regions away from the LOCOS region 108 and placing the other region adjacent to the LOCOS region 108. Also, in the semiconductor device 100, the channel stop region 109 is placed away from the tip of the bird's beak (contour 111) in the opposite direction to the source region 104 and the drain region 105. Therefore, the channel stop region 109 is also placed away from the source region 104 and the drain region 105, thus the degradation of the break down characteristics of the transistor can be suppressed.

In the following, an example of a method of manufacturing the semiconductor device 100 will be explained, with the reference to FIGS. 3A-3D and FIGS. 4A-4C. FIGS. 3A-3D illustrate cross-sections of the semiconductor device 100 corresponding to the cross-section of FIG. 1B at respective manufacturing processes.

Figure 3A:
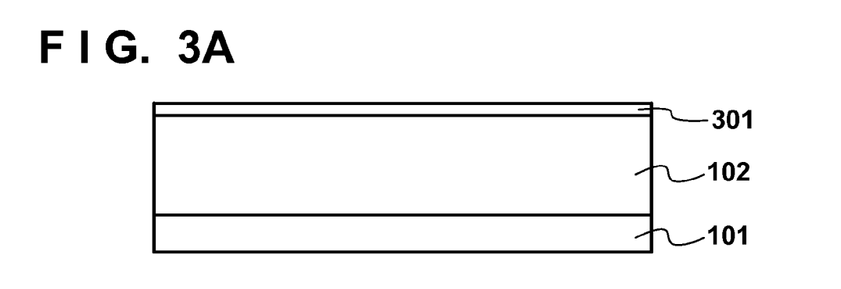
FIGS. 3A-3D are diagrams illustrating an example of a method of manufacturing a semiconductor device according to an embodiment of the present invention.

First, as shown in FIG. 3A, a structure is prepared in which the P-type well region 102 is formed in the N-type semiconductor region 101 of the semiconductor substrate, and a silicon oxide film 301 is placed thereon. An example of processes for forming the structure will be shown hereinafter. The silicon oxide film 301 is formed on the semiconductor substrate, and an N-type impurity layer is formed by ion-implanting phosphorus as an N-type impurity on the whole surface of the semiconductor substrate through the silicon oxide film 301. The thickness of the silicon oxide film 301 is, for example, 100 nm, and phosphorus is implanted, for example, at a dose of 5E+12 cm$^{-2}$. Next, a P-type impurity layer is formed by ion-implanting boron into the N-type impurity layer as a P-type impurity through the silicon oxide 301. Here, a region to be used as an N-type well is covered by a mask (first mask) so that the boron is not ion-implanted. The boron is implanted, for example, at a dose of 1E+13 cm$^{-2}$. Since the P-type impurity layer is formed by counter doping to the N-type impurity region, the concentration of the P-type impurity needs to be higher than that of the N-type impurity layer, and the concentration of the P-type impurity is set to be greater than or equal to double the concentration of the N-type impurity, for example. Next, high temperature diffusion is performed on the semiconductor substrate by an electric furnace, for example, at 1100° C. for 180 minutes, and the P-type well region 102 is formed in the N-type semiconductor region 101 by drive-in of the P-type diffusion layer and the N-type diffusion layer.

Figure 3B:
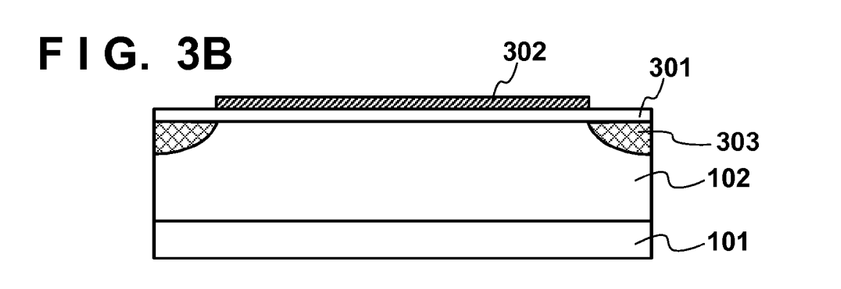

Next, as shown in FIG. 3B, a silicon nitride film 302 is formed on the silicon oxide film 301, and an opening where the channel stop region will be formed is formed by photolithography and etching. The opening is not formed in a location covering the N-type semiconductor region. Next, a P-type impurity region 303 is formed in the well region 102, by implanting boron through the opening of the silicon nitride film 302 at a dose of, for example, 1E+14 cm$^{-2}$.

Figure 3C:
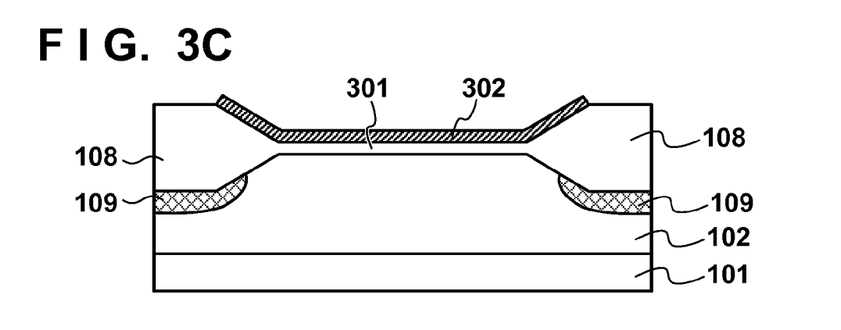

Next, as shown in FIG. 3C, the silicon oxide film 301 is selectively grown by, for example, a hydrogen burning oxidation, and the LOCOS region 108 of a thickness of about 700 nm is formed. By this oxidization, the impurity region 303 is diffused and the channel stop region 109 is formed.

Figure 3D:
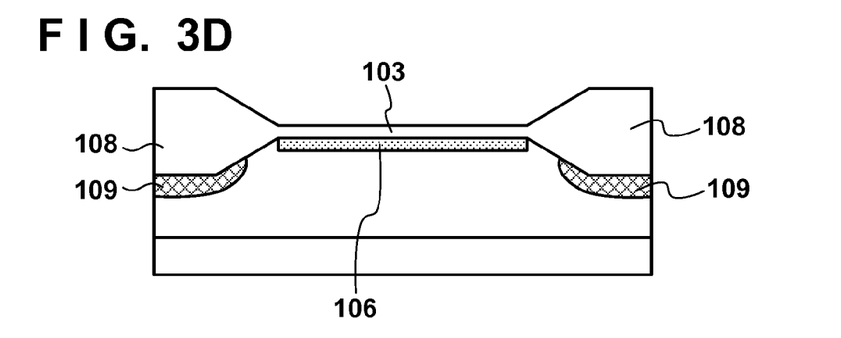

Next, as shown in FIG. 3D, the silicon nitride film 302 is removed and the silicon oxide film 301 that remained without growing is removed. After that, an oxide film is again formed on a region where the channel region is to be formed, and the channel region 106 is formed by ion-implanting boron through the oxide film. The concentration of the boron for forming the channel region 106 will be selected according to a threshold voltage of the transistor. Next, after removing the oxide film, the insulating layer 103, which is, for example, an oxide film of a thickness of about 10 nm, is formed on the channel region 106.

Figure 4A:
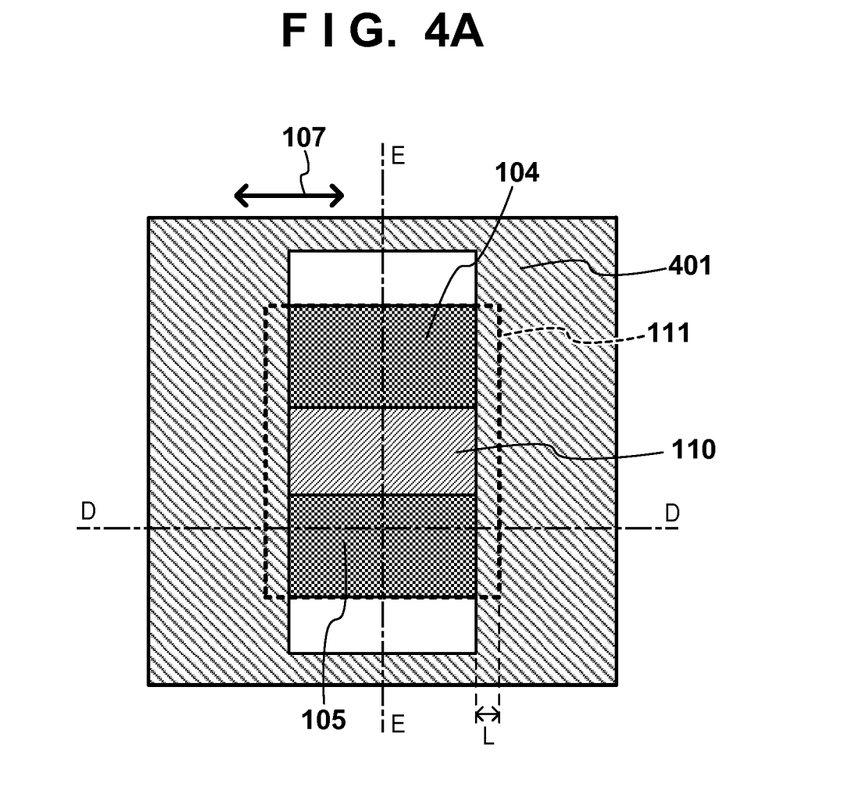
FIGS. 4A-4C are diagrams illustrating an example of a method of manufacturing a semiconductor device according to an embodiment of the present invention.
Figure 4B:
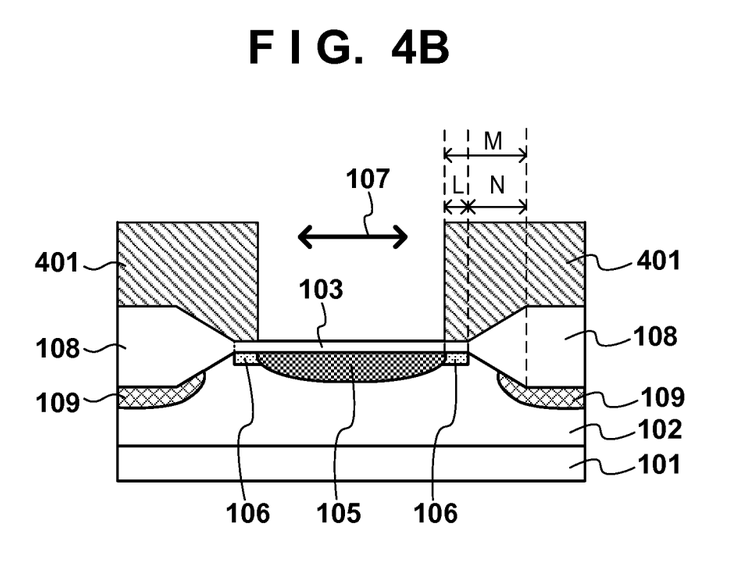
Figure 4C:
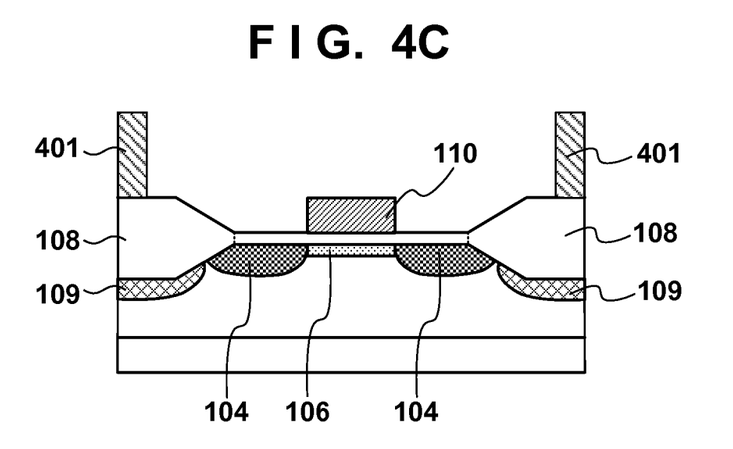

Next, as shown in FIGS. 4A-4C, the gate electrode 110 and a mask 401 (second mask) are formed, and after that, the source region 104 and the drain region 105 are formed. FIG. 4A shows the state of the semiconductor device 100 after the formation of the source region 104 and the drain region 105, FIG. 4B is a cross-sectional view of FIG. 4A along the line D-D, and FIG. 4C is a cross-sectional view of FIG. 4A along the line E-E. At this stage, the thickness of the LOCOS region 108 is reduced to, for example, about 650 nm, and the length of the bird's beak N is, for example, about 0.7 μm. In this state, the gate electrode 110 composed of, for example, polysilicon is formed on the insulating layer 103. Next, the semiconductor substrate is covered by a resist, and the mask 401 is formed by making an opening in the resist to expose the region where the source region 104 and the drain region 105 will be formed. The source region 104 and the drain region 105 are formed by ion-implanting, for example, arsenic at a dose of 5E+15 cm$^{-2}$ through the opening of the mask 401. The mask 401 covers, among the region where the source region 104 and the drain region 105 will be formed, only the distance L from the tip of the bird's beak (that is, contour 111) of the LOCOS region 108 in the direction 107 parallel to the channel width of the transistor. In other words, from the tip of the bird's beak, a portion extending along the direction orthogonal to the channel width is covered by the mask 401. Accordingly, the source region 104 and the drain region 105 are not formed in this region. For example, the mask 401 is patterned so that the distance M from the edge of the opening of the mask 401 to the step of the LOCOS region 108 will be 1.4 μm. In this example, as the length of the bird's beak is 0.7 μm, even if an alignment error of 0.4 μm occurs, the distance L between the LOCOS region 108 and the source region 104 and the drain region 105 can be made greater than or equal to 0.3 μm.

Figure 5A:
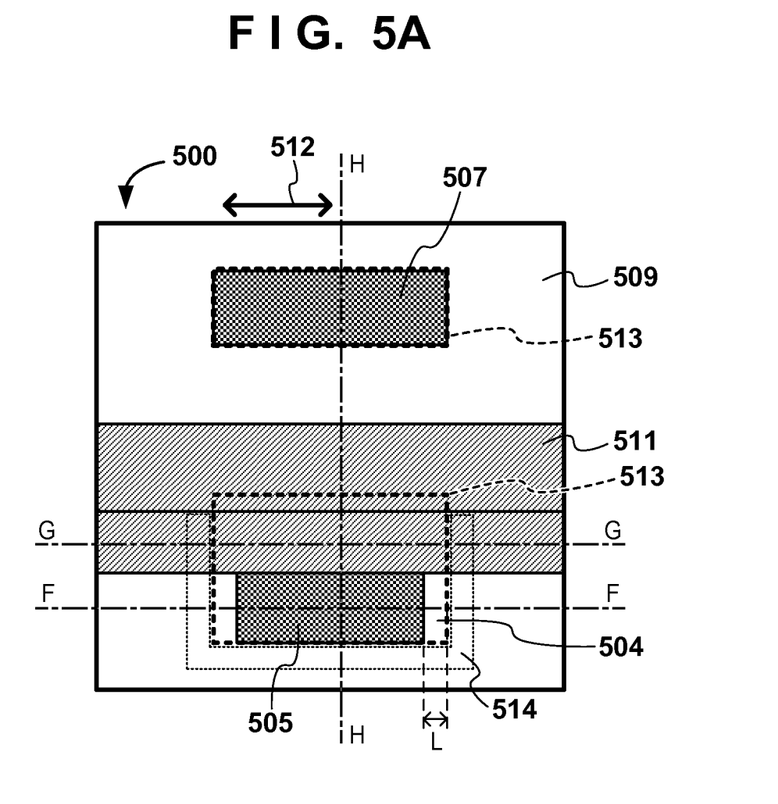
FIGS. 5A-5D are diagrams illustrating an example of a structure of a semiconductor device according to another embodiment of the present invention.
Figure 5B:
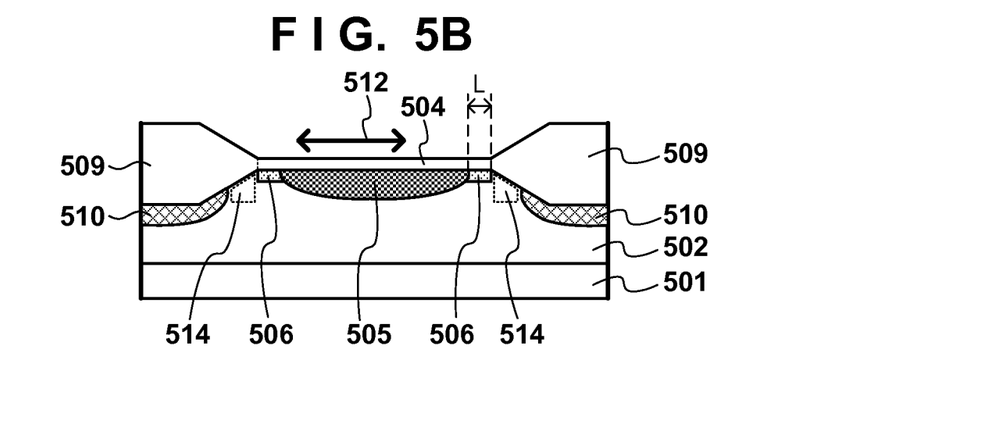
Figure 5C:
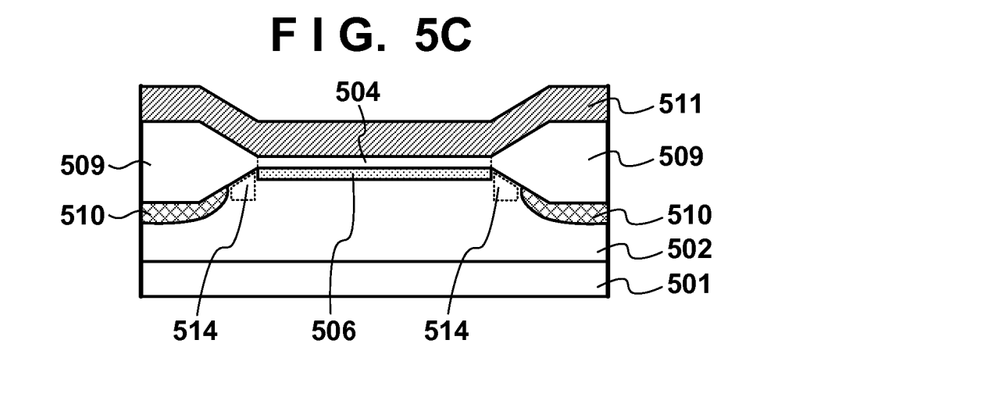
Figure 5D:
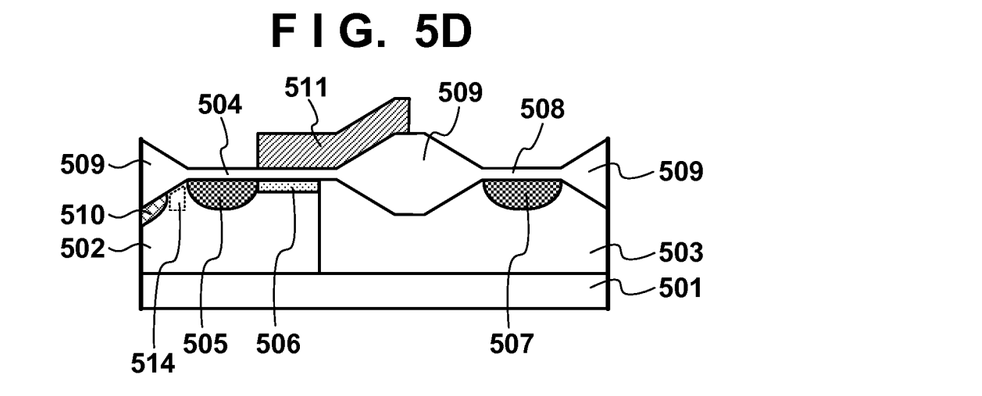

Next, a structure of a semiconductor device 500 according to the embodiment of the present invention will be explained, with reference to FIGS. 5A-5D. The semiconductor device 500 has an N-channel MOS transistor that is one type of reduced surface field (RESURF) type transistor, and FIGS. 5A-5D focus on the region where this transistor is formed. FIG. 5A is a plan view of the portion, FIG. 5B is a cross-sectional view along the line F-F of FIG. 5A, and FIG. 5C is a cross-sectional-view along the line G-G of FIG. 5A, and FIG. 5D is a cross sectional view along the line H-H of FIG. 5A. Although a source region 505 and a drain region 507 are placed under insulating layers 504 and 508, the source region 505 and the drain region 507 are depicted in a visible manner in the plan view of FIG. 5A, for the purpose of explanation.

A P-type semiconductor substrate 501 of the semiconductor device 500 has a P-type well region 502 and an N-type well region 503. The well region 502 can be formed by implanting a P-type impurity into the semiconductor substrate 501. Instead of this, the P-type well region 502 may be formed by implanting the P-type impurity into the N-type well region 503. The well region 503 acts as a drain reduced field layer. The semiconductor device 500 has an insulating layer 504 on the well region 502, and a part of the insulating layer 504 acts as a gate insulating film of a transistor. The semiconductor device 500 has an N-type source region 505 and a channel region 506 adjacent to the source region 505 in the well region 502. The semiconductor device 500 has, in the well region 503, an N-type drain region 507 with an impurity concentration higher than that of the well region 503. An insulating layer 508 is placed on the drain region 507. The semiconductor device 500 has a LOCOS region 509 on the well regions 502 and 503 at the periphery of the source region 505 and the channel region 506 and at the periphery of the drain region 507. The LOCOS region 509 insulates and separates the transistor from other elements. In order to improve the element isolation characteristics, the semiconductor device 500 may have a channel stop region 510 in the well region 502 under the LOCOS region 509. The semiconductor device 500 has a gate electrode 511 on the channel region 506 through the insulating layer 504. The gate electrode 511 extends in a direction 512 parallel to the channel width, and covers a part of the LOCOS region 509. The gate electrode 511 extends beyond a boundary between the well region 502 and the well region 503, and overlaps with the LOCOS region 509 formed in the well region 503.

In FIG. 5A, a contour 513 of the LOCOS region 509 is shown with a dotted line, for reference. In other words, a tip of a bird's beak is located at the contour 513. In this embodiment, the contour 513 is located at the boundary between the LOCOS region 509 and the insulating layer 504 and at the boundary between the LOCOS region 509 and the insulating layer 508.

The source region 505 is placed, in the direction 512 parallel to the channel width, at the distance L from the tip of the bird's beak of the LOCOS region 509 (that is, from the contour 513). By thus placing the source region at a distance from the LOCOS region, as in the case of the semiconductor device 100, a leak current passing through a region 514, in the well region 502, which is located under the LOCOS region 509 and the channel stop region 510 is not formed therein can be suppressed. For example, assume that, in the case where phosphorous is doped by greater than or equal to $1E+16$ cm$^{-3}$ in the well region 502, and arsenic is doped by greater than or equal to $1E+19$ cm$^{-3}$ in the source region 505 and the drain region 507, the distance L is greater than or equal to 0.3 μm. As a result, a leak current flowing between the source region 104 and the drain region 105 can be effectively suppressed. As the semiconductor device 500 is realized by combining the processes of the mask 401 explained above in FIGS. 4A-4C with an existing manufacturing method of a RESURF transistor, detailed explanation will be omitted.

Figure 6:
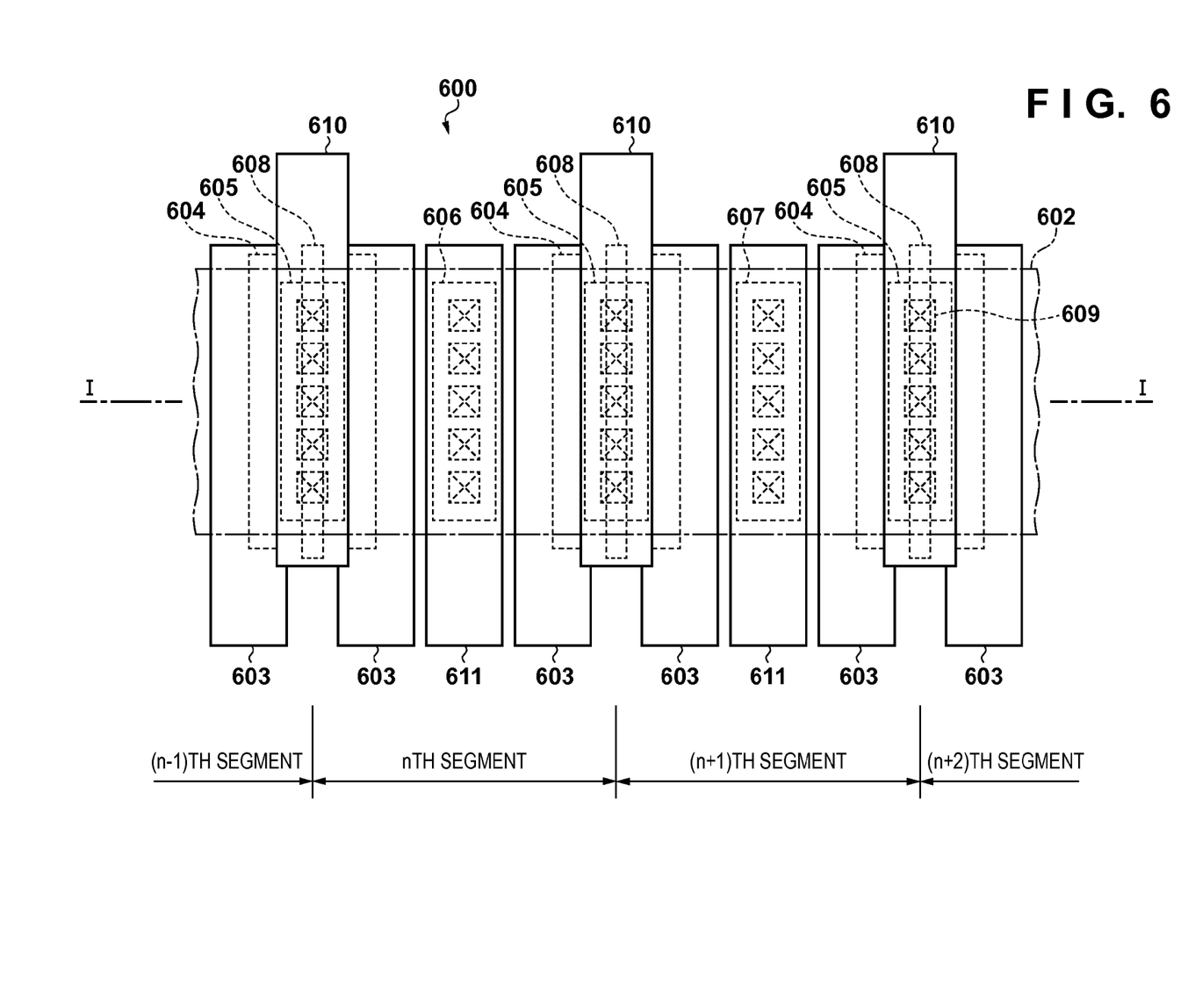
FIG. 6 is a diagram illustrating a semiconductor device for a liquid discharge apparatus according to an embodiment of the present invention.
Figure 7:
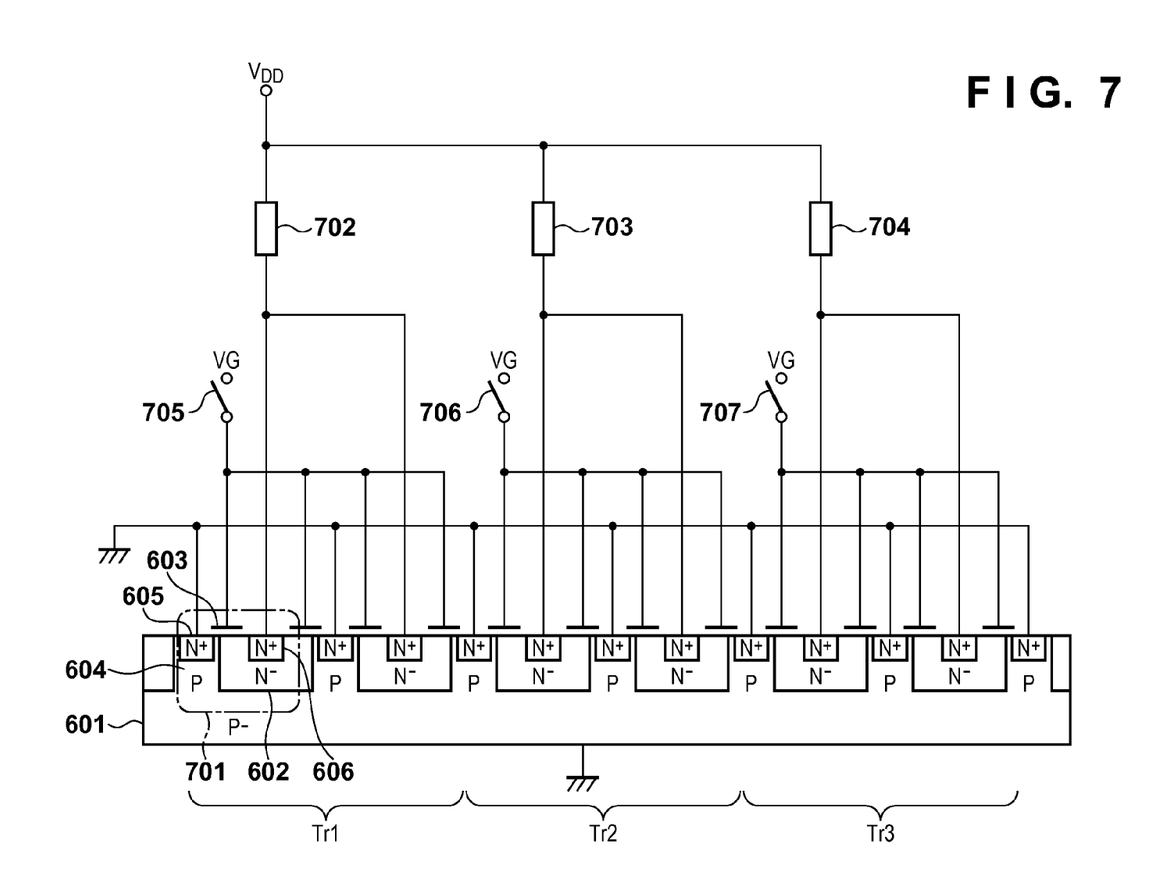
FIG. 7 is a diagram illustrating a semiconductor device for a liquid discharge apparatus according to an embodiment of the present invention.
Figure 8:
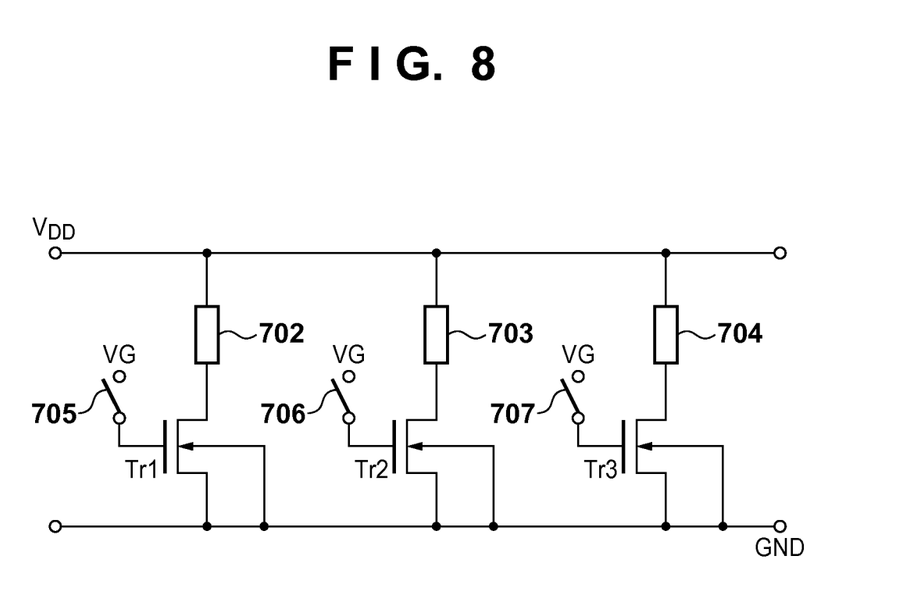
FIG. 8 is a diagram illustrating a semiconductor device for a liquid discharge apparatus according to an embodiment of the present invention.

A part of the embodiment of the present invention relates to a liquid discharge apparatus, and more particularly to a liquid discharge apparatus applicable to an recording apparatus used as an output terminal for an information device such as a copy machine, a fax machine, a word processor, a computer, and the like, or to an apparatus used for manufacturing a DNA chip, an organic transistor, a color filter, or the like. As the liquid discharge apparatus, a recording apparatus such as an ink jet printer will be explained as an example. A semiconductor device 600, for a liquid discharge apparatus, according to the embodiment of the present invention will be explained in detail, with reference to FIGS. 6-8. FIG. 7 is a cross-sectional view along the line I-I of FIG. 6, and FIG. 8 is an equivalent circuit of the semiconductor device 600 of FIG. 6.

The semiconductor device 600 may have a P-type semiconductor substrate 601, an N-type well region 602, a gate electrode 603, a P-type base region 604, an N-type source region 605, and N-type drain regions 606 and 607. The semiconductor device 600 may also have a diffusion layer 608 for taking out a base electrode, a contact 609, a source electrode 610, and a drain electrode 611. The semiconductor 600 may further have transistors 701, Tr1, Tr2, and Tr3 as switching elements, electrothermal transducers 702 to 704 as loads, and switches 705 to 707. The transistors 701, Tr1, Tr2, and Tr3 may have the same structure as the transistor contained in the semiconductor devices 100 and 500.

The electrothermal transducers 702 to 704 are integrated and placed in an array on a principal surface of the semiconductor substrate 601 by a thin film process. In the same way, the switching elements Tr1 to Tr3 are placed in an array on the principal surface of the semiconductor substrate 601. If necessary, an integration density is increased by making the array directions of the electrothermal transducers and the switching elements parallel to each other. In this case, the switching elements can be placed in the array shown in FIGS. 6-8. Here a structure is adopted in which the transistors connected to the electrothermal transducers have the same structure, and a dedicated LOCOS region is not required between the transistors in a transistor array.

One segment is constituted by two gate electrodes, two source regions and a drain region. Two gate electrodes are placed on opposite sides of the drain region, and the two source regions are placed at the opposite side of the drain region and are shared with the adjacent segment. In an example shown in FIG. 7, the drain of the two segments are connected to one of the electrodes of the electrothermal transducer, and the common source is connected to a low reference voltage source supplying a relatively low reference voltage such as 0 V. The other electrode of the electrothermal transducer is connected to a high reference voltage source supplying a relatively high reference voltage VDD such as +10 to 30 V.

A brief explanation of an operation of the semiconductor device 600 will be given. A reference voltage such as a ground potential, for example, is given to the P-type semiconductor substrate 601 and the source region 605. One of the electrodes of each of the electrothermal transducers 702 to 704 (supply terminal) is then supplied with a reference voltage VDD. In the case where only the electrothermal transducer 702 is supplied with a current, for example, only the switch 705 is turned on and supplies a gate voltage VG to the gate electrode 603 of the transistors in the two segments which make up the switching element Tr1, so that the switching element Tr1 is turned on. Then, a current flows from a supply terminal through the electrothermal transducer 702 and the switching element Tr1 to a ground terminal, and a heat is generated at the electrothermal transducer 702. As is well known, this heat is then used to discharge liquid.

The two gate electrodes 603 are placed on opposite sides of the source region 605, and both the base region 604 and the source region 605 are formed in a self-aligning manner using the gate electrode 603 as a mask. Therefore, no dimensional error occurs at alignment, and the transistor 701 can be manufactured without a fluctuation of threshold voltage, so that a high yield with high reliability is realized.

In the embodiment shown in FIGS. 7-8, an example in which the two drains of the transistors connected in parallel (two segments) are connected to one independently drivable load. It is configured that, when an ON signal is given to the gate to drive the load, the transistor turns on and a current flows from the drain through channels at the both side of the drain to the common source. The source region at the boundary of adjacent segments can be commonly used. In addition, a leak current flowing from the drain to the P-type substrate 601 can be sufficiently suppressed.

A liquid discharge head according to a part of the embodiment can be manufactured by forming a heater (thin film resistor) on an insulating layer of a semiconductor device 600, and combining orifice molding materials such as a top board composed of a molding resin, a film, or the like, to form an ink orifice and a liquid passage in communication therewith. The function of an ink jet printer is achieved by mounting the liquid discharge head being connected a container on a printer body, supplying a supply voltage from a power circuit of the printer body, and supplying image data from an image processing circuit.

Figure 9:
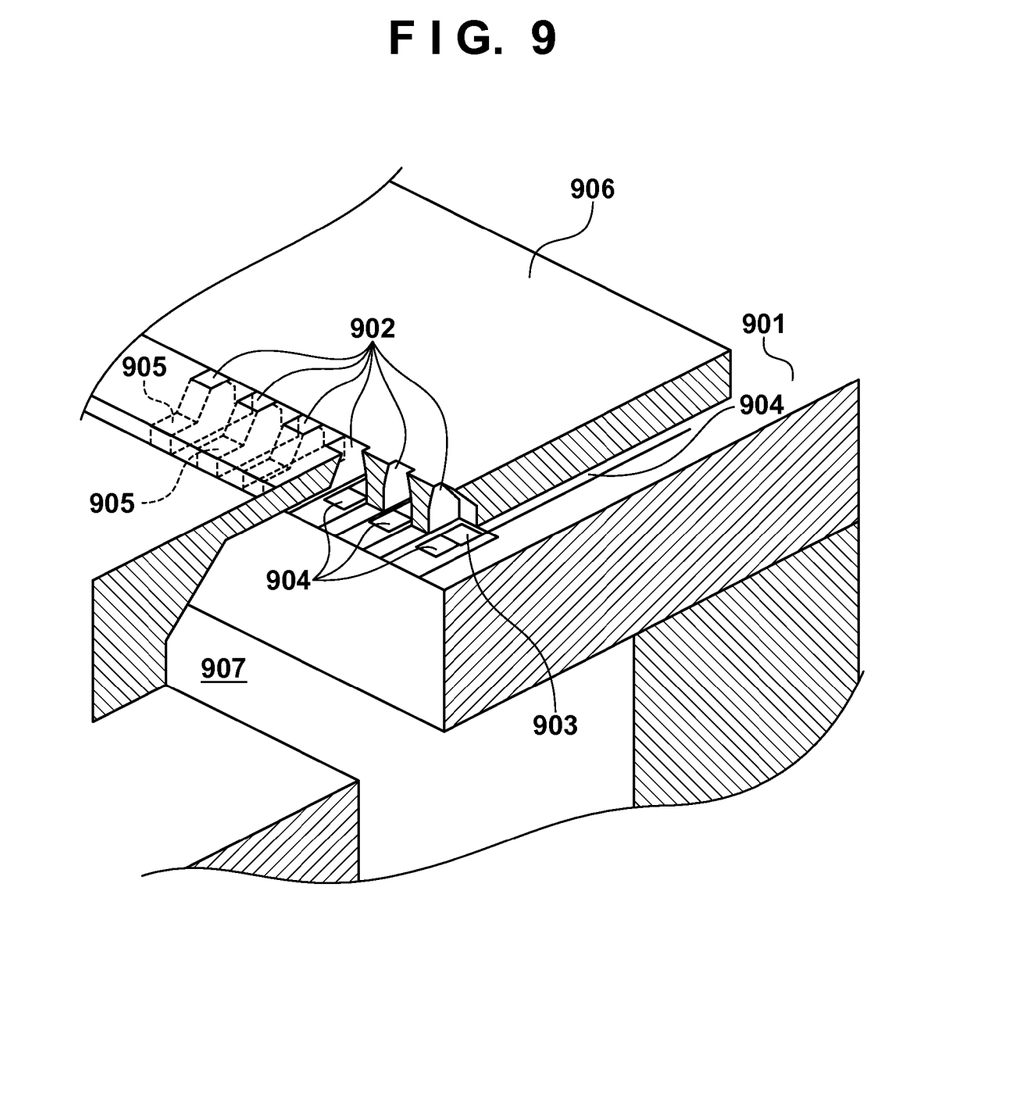
FIG. 9 is a diagram illustrating an example of a liquid discharge head according to an embodiment of the present invention.

FIG. 9 is a schematic diagram explaining a liquid discharge head according to an embodiment of the present invention, and shows a portion of the liquid discharge head. The liquid discharge head has a plurality of electrothermal transducers 903 for generating heat with a current flowing therethrough and discharging ink from orifices 902 with bubbles generated by the heat. The electrothermal transducers 903 are arranged in column on a substrate 901 on which semiconductor devices according to the embodiment described above, are formed. For each of the electrothermal transducers 903, an electrode 904 is placed to supply an electric signal to drive each electrothermal transducer 903, and one end of the electrode 904 is connected electrically to the transistor described above.

In the liquid discharge head, a flow passage 905 is provided for each orifice 902 to supply an ink to the orifice 902 placed in a position facing the electrothermal transducer 903. A wall constituting these orifices 902 and the flow passages 905 are provided in a member with a groove 906, and by connecting these members with a groove 906 to the substrate 901 described above, the flow passage 905 and a common ink chamber 907 (ink tank) which supplies the ink to the plurality of flow passages are provided.

Figure 10:
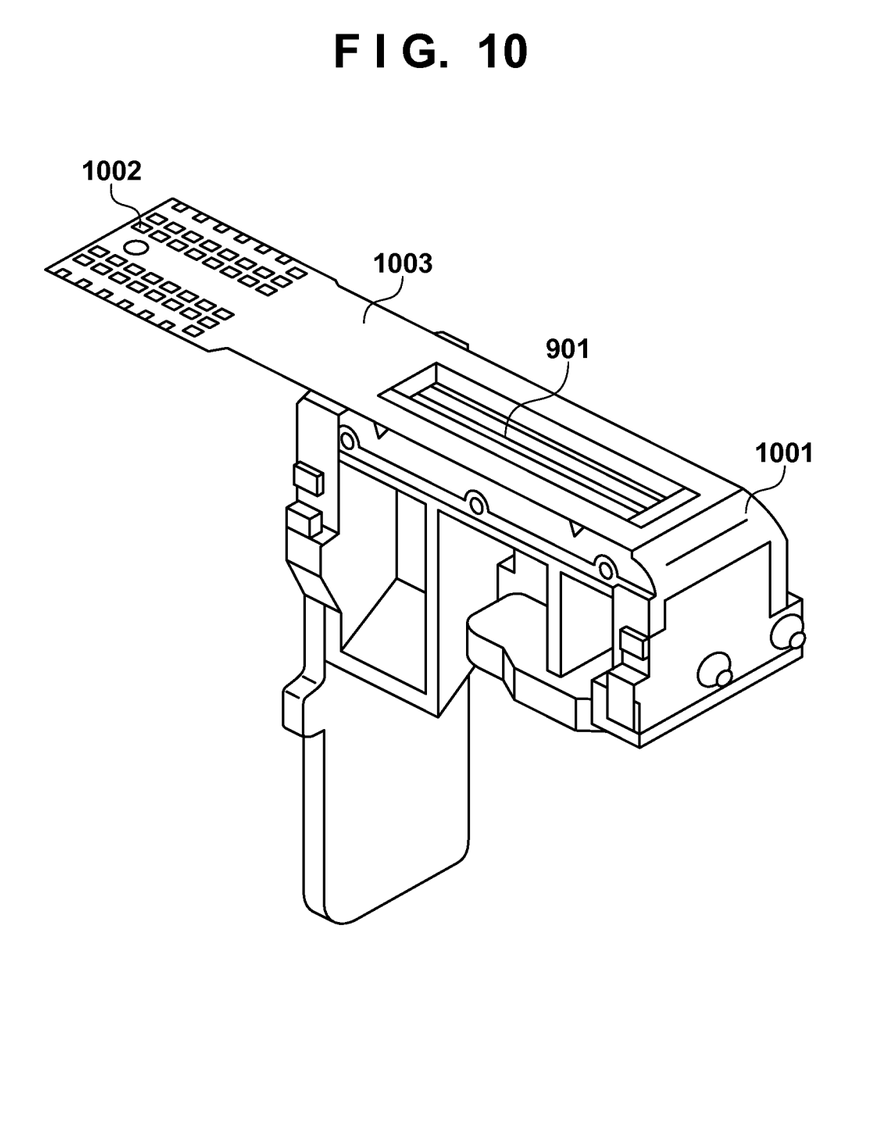
FIG. 10 is a diagram illustrating an example of a liquid discharge head according to an embodiment of the present invention.

FIG. 10 shows a structure of the liquid discharge apparatus incorporating the substrate 901, where a frame member 1001 incorporates the substrate 901. On the substrate 901, the orifice 902 described above and the material with a groove 906 to constitute the flow passage 905 are attached. A contact pad 1002 is provided to receive an electric signal from the device, and the electric signal as a driving signal is provided from a controller of the device main body to the substrate 901 through a flexible print circuit board 1003.

Figure 11:
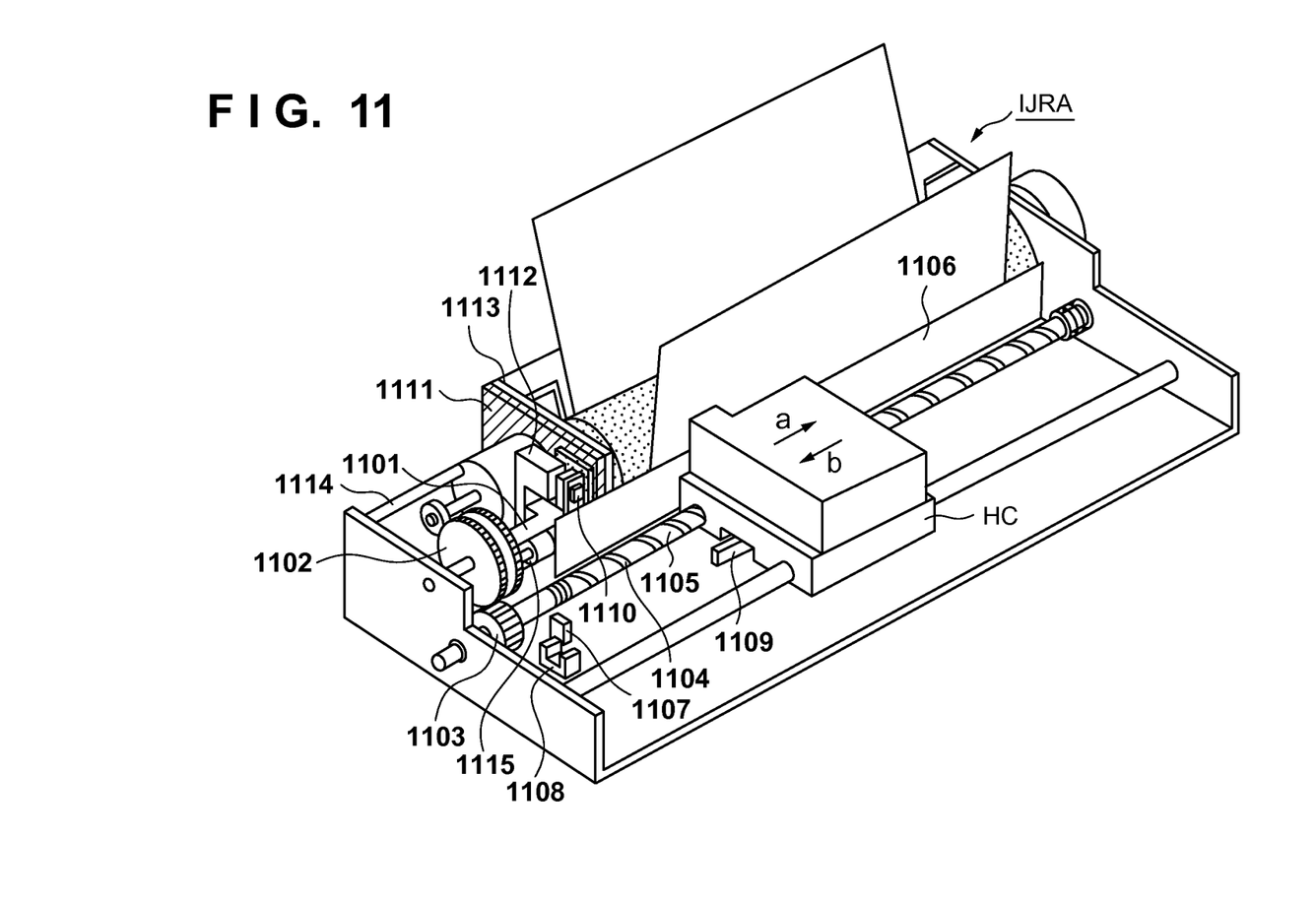
FIG. 11 is a diagram illustrating an example of a liquid discharge apparatus according to an embodiment of the present invention.

FIG. 11 is a schematic diagram explaining a liquid discharge apparatus according to the embodiment of the present invention, and shows a bird's eye view of an inkjet recording apparatus IJRA. A carriage HC, in engagement to a spiral groove 1105 on a lead screw 1104 which is rotating through driving force transmission gears 1102 and 1103 in coordination with a positive and inverse rotation of a driving motor 1101, has a pin (not shown) and moves back and forth in the direction shown in arrows a and b. A paper bail board 1106 presses a paper against a platen which has a record medium carrying function for the region the carriage moves. Photo couplers 1107 and 1108 has a home position detection function, which detects a lever 1109 of the carriage in the region where the photo couplers are located and switches the direction of rotation of the driving motor 1101. A suction port sucks inside of a cap which caps a front side of a recording head, and performs suction recovery of the recording head through an opening inside the cap 1110. A member 1111 makes a cleaning blade movable back and forth, and the cleaning blade 1112 and the member 1111 are supported by a body supporting board 1113. A lever 1114 to start suction of the suction recovery moves with a movement of a cam 1115 in engagement with the carriage, and a driving force of the driving motor is movement-controlled by a known transmission unit such as a clutch switching and the like.

These capping, cleaning and suction recovery operations are configured such that desired processing is performed at corresponding locations by the function of the lead screw 1104 when the carriage arrives at the home position area. However, a configuration is possible in which desired operations are performed at a well-known timing. The device has a controller driving signal supply unit (not shown) consisting of an electric circuit for supplying a supply voltage, image signals and driving control signals to the substrate 901.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-121388, filed May 28, 2012, which is hereby incorporated by reference herein in its entirety.

What is claimed is:

1. A semiconductor device comprising:
a first conductivity type well region formed by counter doping;
a transistor having a source region and a drain region having a second conductivity type which is different from the first conductivity type, at least one of the source region and the drain region being arranged in the well region;
a LOCOS region arranged around the at least one of the source region and the drain region in the well region; and
a channel stop region having the first conductivity type arranged under the LOCOS region,
wherein the at least one of the source region and the drain region is arranged at a distance from a tip of a bird's beak of the LOCOS in a direction parallel to a channel width of the transistor, and
the channel stop region is arranged at a distance from the tip of the bird's beak at an opposite side to the at least one of the source region and the drain region.

2. The device according to claim 1, wherein both the source region and the drain region are arranged in the well region.

3. The device according to claim 1,
wherein the source region is arranged in the well region, and the drain region is arranged in a semiconductor region having the second conductivity type adjacent to the well region, and
wherein the source region is arranged at a distance from the LOCOS region in the direction parallel to the channel width of the transistor.

4. The device according to claim 1, further comprising:
a plurality of the transistors; and
a plurality of electrothermal transducers,
wherein an array direction of the plurality of the electrothermal transducers and an array direction of the plurality of transistors are parallel.

5. The device according to claim 4,
wherein the drain regions of at least two of the transistors are connected to one of the single electrothermal transducers, and the source regions of the plurality of the transistors are commonly connected.

6. The device according to claim 4,
wherein a liquid orifice is arranged corresponding to the electrothermal transducer.

7. The device according to claim 4,
wherein the electrothermal transducers are thin film resistors arranged on a semiconductor substrate.

8. A liquid discharge apparatus comprising:
the semiconductor device according to claim 1, wherein a liquid orifice is arranged corresponding to an electrothermal transducer;
a liquid container for containing a liquid which is discharged from the liquid orifice by the electrothermal transducer; and
a controller configured to supply a drive control signal for driving the transistor of the semiconductor device.

9. A method of manufacturing a semiconductor device having a transistor, comprising:
preparing a semiconductor substrate having an oxide film which is arranged on a well region having a first conductivity type, the well being formed by a counter doping;
forming, on the well region, a first mask which covers a region where a source region and a drain region of the transistor are to be formed, and exposes a region where a LOCOS region is to be formed;
implanting an impurity having the first conductivity type in the well region through an opening of the first mask;
removing the first mask after forming the LOCOS region by selectively growing the oxide film;
forming, on the well region and the LOCOS region, a second mask which exposes a region where the source region and the drain region are to be formed, and covers a portion extending orthogonal to a channel width direction of the transistor from a tip of a bird's beak of the LOCOS region; and
forming the source region and the drain region by implanting an impurity having a second conductivity type that is different from the first conductivity type through an opening of the second mask in the well region.

* * * * *